United States Patent
Niizuma et al.

(10) Patent No.: US 10,076,058 B2
(45) Date of Patent: Sep. 11, 2018

(54) COOLING DEVICE AND WIRELESS POWER SUPPLY SYSTEM

(71) Applicant: IHI CORPORATION, Tokyo (JP)

(72) Inventors: Motonao Niizuma, Tokyo (JP); Akio Ueda, Tokyo (JP)

(73) Assignee: IHI CORPORATION, Tokyo (JP)

( * ) Notice: Subject to any disclaimer, the term of this patent is extended or adjusted under 35 U.S.C. 154(b) by 0 days.

(21) Appl. No.: 15/263,431

(22) Filed: Sep. 13, 2016

(65) Prior Publication Data
US 2016/0381829 A1 Dec. 29, 2016

Related U.S. Application Data

(63) Continuation of application No. PCT/JP2015/058507, filed on Mar. 20, 2015.

(30) Foreign Application Priority Data

May 19, 2014 (JP) .................. 2014-103612

(51) Int. Cl.
| | |
|---|---|
| *H05K 7/20* | (2006.01) |
| *B60L 11/18* | (2006.01) |
| *H02J 50/10* | (2016.01) |
| *H02J 50/70* | (2016.01) |
| *H02J 50/12* | (2016.01) |
| *H02J 7/02* | (2016.01) |
| *H02J 7/00* | (2006.01) |

(52) U.S. Cl.
CPC ........ *H05K 7/20272* (2013.01); *B60L 11/182* (2013.01); *H02J 7/00* (2013.01); *H02J 7/025* (2013.01); *H02J 50/10* (2016.02); *H02J 50/12* (2016.02); *H02J 50/70* (2016.02); *H05K 7/209* (2013.01); *H05K 7/20927* (2013.01); *Y02T 10/7005* (2013.01); *Y02T 10/7072* (2013.01); *Y02T 90/122* (2013.01); *Y02T 90/14* (2013.01)

(58) Field of Classification Search
CPC ........ H02J 7/025; Y20T 90/122; B60L 11/182
See application file for complete search history.

(56) References Cited

U.S. PATENT DOCUMENTS

| | | | |
|---|---|---|---|
| 5,684,380 A | 11/1997 | Woody et al. | |
| 5,909,099 A * | 6/1999 | Watanabe | A61K 31/726 320/108 |
| 8,266,802 B2 * | 9/2012 | Campbell | H01L 23/4735 165/80.3 |
| 8,912,687 B2 * | 12/2014 | Kesler | B60L 11/182 307/10.1 |
| 8,922,066 B2 * | 12/2014 | Kesler | B60L 11/1812 307/104 |
| 8,928,276 B2 * | 1/2015 | Kesler | H02J 17/00 307/104 |

(Continued)

FOREIGN PATENT DOCUMENTS

| | | |
|---|---|---|
| CN | 102639725 A | 8/2012 |
| CN | 103541045 A | 1/2014 |

(Continued)

*Primary Examiner* — Robert J Hoffberg
(74) *Attorney, Agent, or Firm* — Volpe and Koenig, P.C.

(57) ABSTRACT

A cooling device of the present disclosure is attached to a park station where wireless power supply is performed to a vehicle using a coil and cools a coil provided on the vehicle by spraying a coolant.

19 Claims, 4 Drawing Sheets

(56) References Cited

U.S. PATENT DOCUMENTS

| | | | | |
|---|---|---|---|---|
| 8,933,594 | B2* | 1/2015 | Kurs | B60L 3/003 |
| | | | | 307/104 |
| 8,946,938 | B2* | 2/2015 | Kesler | B60L 11/182 |
| | | | | 307/10.1 |
| 8,957,549 | B2* | 2/2015 | Kesler | H03H 7/40 |
| | | | | 307/104 |
| 9,187,795 | B2 | 11/2015 | Katsumata et al. | |
| 9,566,870 | B2* | 2/2017 | Amma | B60L 11/182 |
| 9,698,607 | B2* | 7/2017 | Kesler | B60L 11/182 |
| 9,711,971 | B2* | 7/2017 | Maekawa | H02J 5/005 |
| 9,902,279 | B2* | 2/2018 | Araki | B60L 11/1824 |
| 2011/0074346 | A1* | 3/2011 | Hall | B60L 3/00 |
| | | | | 320/108 |
| 2012/0112535 | A1* | 5/2012 | Karalis | B60L 11/1812 |
| | | | | 307/10.1 |
| 2012/0112536 | A1* | 5/2012 | Karalis | B60L 11/182 |
| | | | | 307/10.1 |
| 2012/0112538 | A1* | 5/2012 | Kesler | B60L 11/182 |
| | | | | 307/10.1 |
| 2012/0112691 | A1* | 5/2012 | Kurs | B60L 11/182 |
| | | | | 320/108 |
| 2012/0119569 | A1* | 5/2012 | Karalis | B60L 11/1812 |
| | | | | 307/9.1 |
| 2012/0119698 | A1* | 5/2012 | Karalis | B60L 11/182 |
| | | | | 320/108 |
| 2012/0228953 | A1* | 9/2012 | Kesler | H03H 7/40 |
| | | | | 307/104 |
| 2012/0242014 | A1 | 9/2012 | Katsumata et al. | |
| 2013/0175987 | A1 | 7/2013 | Amma et al. | |
| 2014/0084859 | A1* | 3/2014 | Hall | B60L 3/00 |
| | | | | 320/108 |
| 2015/0283910 | A1* | 10/2015 | Eymann | B60L 11/182 |
| | | | | 307/104 |
| 2017/0043672 | A1* | 2/2017 | Araki | H02J 7/00 |
| 2017/0338023 | A1* | 11/2017 | Ansari | H01F 27/025 |

FOREIGN PATENT DOCUMENTS

| | | |
|---|---|---|
| EP | 0823767 A1 | 2/1998 |
| EP | 2905872 A1 | 8/2015 |
| JP | 2008-054423 A | 3/2008 |
| JP | 2011-135729 A | 7/2011 |
| JP | 2012-130177 A | 7/2012 |
| JP | 2012-156083 A | 8/2012 |
| JP | 2013-074214 A | 4/2013 |
| WO | 2014/045375 A1 | 3/2014 |
| WO | 2014/054358 A1 | 4/2014 |

* cited by examiner

COOLING DEVICE AND WIRELESS POWER SUPPLY SYSTEM

This application is a continuation application based on a PCT Patent Application No. PCT/JP2015/058507, filed on Mar. 20, 2015, whose priority is claimed on Japanese Patent Application No. 2014-103612, filed on May 19, 2014. The contents of both the PCT application and the Japanese Patent Application are incorporated herein by reference.

TECHNICAL FIELD

The present disclosure relates to a cooling device and a wireless power supply system.

DESCRIPTION OF RELATED ART

Patent Document 1 below discloses a vehicle-mounted power receiving device that receives a high frequency power in a wireless manner from a primary coil by using a magnetic coupling or a magnetic resonance between the primary coil provided on a road or the like and a secondary coil provided on a vehicle. In a wireless power supply system that uses the magnetic coupling or the like, the coil or the like exchanging the high frequency power generates heat, and thus cooling thereof is performed.

The vehicle-mounted power receiving device according to Patent Document 1 below is configured to include a power receiving coil, a coil chamber that houses the power receiving coil, and a bidirectional fan that is capable of switching directions of rotation between a positive rotation and a reverse rotation. A heat radiation flow comes into play from a passenger compartment side to an outside air side via the power receiving coil when the power receiving coil is required to be cooled, and a warm-up flow comes into play from the outside air side to the passenger compartment side via the power receiving coil when a power storage device is required to be warmed up.

In addition, Patent Document 2 below discloses a charging unit that performs wireless power exchange by using a power receiving device which has a power receiving unit and a battery and a power transmitting device which has a power supply unit. In this charging unit, a heat conductive portion is provided at a part where the power receiving device and the power transmitting device are in contact with each other such that heat generated in the power receiving device is transferred to the power transmitting device, and the heat transferred to the power transmitting device side is radiated outwards via a heat sink.

DOCUMENT OF RELATED ART

Patent Document

Patent Document 1: Japanese Unexamined Patent Application, First Publication No. 2012-156083
Patent Document 2: Japanese Unexamined Patent Application, First Publication No. 2012-130177

SUMMARY OF DISCLOSURE

Technical Problem

However, the related art described above has the following problems.

The technique that is disclosed in Patent Document 1 is for cooling using the vehicle-mounted fan, and thus has a problem that the vehicle size increases due to the cooling device.

The technique that is disclosed in Patent Document 2 is to transfer the heat by contact from the power receiving device side to the power transmitting device side without fan or the like being mounted on the power receiving device side as an object to be cooled, in which heat transfer efficiency is extremely reduced when relative position between the power receiving device and the power transmitting device is not strictly fixed. Accordingly, in a case where the object to be cooled is a movable body such as a vehicle, a problem arises that accurate positioning of the movable body at a time of parking is time-consuming.

The present disclosure has been made in view of the above-described circumstances, and an object thereof is to provide a cooling device and a wireless power supply system that are capable of appropriately cooling a coil heating during wireless power supply, without requiring time for positioning, when a power receiving device and a power transmitting device are in a relatively movable relationship.

Solution to Problem

A cooling device according to a first aspect of the present disclosure is attached to a power transmitting device that performs wireless power supply using a coil on a movable power receiving device using a coil and cools a coil provided on the power receiving device by spraying a coolant.

In addition, a cooling device according to a second aspect of the present disclosure is attached to a power receiving device that receives wireless power supply using a coil from a movable power transmitting device and cools a coil provided on the power transmitting device by spraying a coolant.

In addition, the cooling device according to a third aspect of the present disclosure includes a heat transfer plate thermally connected to the coil provided on the power receiving device and the cooling device sprays the coolant toward at least either one of the coil provided on the power receiving device and the heat transfer plate.

In addition, the cooling device according to a fourth aspect of the present disclosure includes a heat transfer plate thermally connected to the coil provided on the power transmitting device and the cooling device sprays the coolant toward at least either one of the coil provided on the power transmitting device and the heat transfer plate.

In addition, in the cooling device according to a fifth aspect of the present disclosure, the cooling device sprays the coolant obliquely with respect to a facing direction in which the coils face each other at a time of the wireless power supply.

In addition, in the cooling device according to a sixth aspect of the present disclosure, the cooling device sprays the coolant in at least either one of a jet form and a mist form.

In addition, in the cooling device according to a seventh aspect of the present disclosure, the cooling device includes a coolant jetting member where a coolant jet port is provided and the coolant jetting member has non-magnetic and non-electroconductive properties.

In addition, in the cooling device according to an eighth aspect of the present disclosure, at least a part of the coolant jetting member is provided in a facing region where the coils face each other at the time of the wireless power supply.

In addition, in the cooling device according to a ninth aspect of the present disclosure, at least either one of the coil provided on the power transmitting device and the coil provided on the power receiving device is covered by a non-magnetic and a non-electroconductive cover member.

In addition, in the cooling device according to a tenth aspect of the present disclosure, the cover member covering a coil on a lower one in a gravity direction of either the coil provided on the power transmitting device and the coil provided on the power receiving device is inclined obliquely with respect to the gravity direction.

In addition, the cooling device according to an eleventh aspect of the present disclosure includes a receiving member recovering at least a part of the sprayed coolant.

In addition, a wireless power supply system according to a twelfth aspect of the present disclosure performs wireless power supply using a coil between a power receiving device and a power transmitting device, at least either one of the power receiving device and the power transmitting device being movable, and includes the above-described cooling device as a cooling device cooling at least either one of the coils provided on the power receiving device and the power transmitting device.

Effects

According to the present disclosure, even when the relative position between the power receiving device and the power transmitting device is unfixed, a wide area can be cooled because the coolant is diffused in the air during the spraying and wet-spreads after the spraying or by the coolant being sprayed from a plurality of locations. Accordingly, the coils can be cooled while a positional deviation is allowed, and a high level of cooling capacity is obtained.

Accordingly, in the present disclosure, the cooling device and the wireless power supply system are obtained that are capable of appropriately cooling the coil heating during the wireless power supply, without requiring time for positioning, when the power receiving device and the power transmitting device are in a relatively movable relationship.

DESCRIPTION OF EMBODIMENTS

Hereinafter, embodiments of the present disclosure will be described with reference to accompanying drawings.

(First Embodiment)

Figure 1:
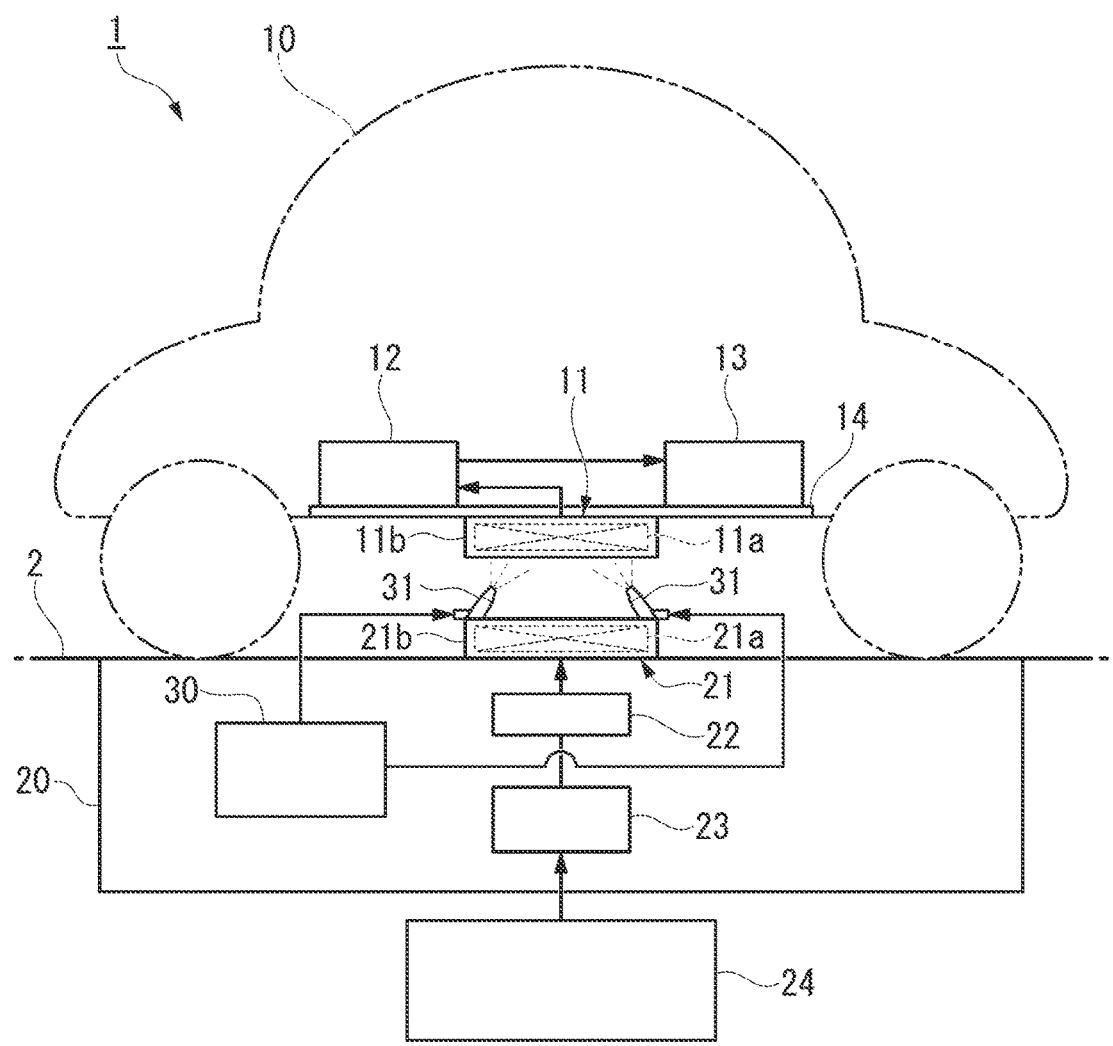
FIG. 1 is an overall configuration diagram of a wireless power supply system according to a first embodiment of the present disclosure.

FIG. 1 is an overall configuration diagram of a wireless power supply system 1 according to a first embodiment of the present disclosure.

The wireless power supply system 1 performs wireless power supply between a power receiving device and a power transmitting device, one or both of which are movable. As shown in FIG. 1, in this embodiment, a vehicle 10 is the power receiving device and a park station 20, where the vehicle 10 parks, is the power transmitting device. The vehicle 10 is capable of moving relative to the park station 20 that is provided under a road surface 2.

A power reception side pad 11 for power reception is provided on the vehicle 10. A power transmission side pad 21 for power transmission is provided on the park station 20. The power reception side pad 11 is provided in a bottom portion of the vehicle 10 to be capable of facing the power transmission side pad 21 on a ground side. This power reception side pad 11 has a coil 11a, and receives power in a wireless manner by being electromagnetically coupled to a coil 21a of the power transmission side pad 21. The coil 11a and a cover member 11b that covers the coil 11a constitute the power reception side pad 11. In addition, the coil 21a and a cover member 21b that covers the coil 21a constitute the power transmission side pad 21. A non-magnetic and non-electroconductive material constitutes the cover members 11b and 21b so that an electromagnetic field transferring the power during the wireless power supply is not interfered with.

The wireless power supply from the power transmission side pad 21 to the power reception side pad 11 of the wireless power supply system 1 according to this embodiment is performed by a magnetic field resonance method. In other words, a resonance capacitor (not shown) for constituting a resonance circuit in each of the coil 21a and the coil 11a is connected to the coil 21a and the coil 11a. In addition, capacitance of the resonance capacitor is set such that, for example, a power transmission side resonance circuit that the coil 21a and the resonance capacitor constitute and the power reception side resonance circuit that the coil 11a and the resonance capacitor constitute have the same resonant frequency.

The vehicle 10 is provided with a power reception side power conversion circuit 12 and a load 13 as well as the power reception side pad 11.

The power reception side power conversion circuit 12 is a power conversion circuit that converts the power which the power reception side pad 11 receives from the power transmission side pad 21 by the wireless power supply to DC power and supplies the DC power to the load 13.

In other words, this power reception side power conversion circuit 12 supplies the load 13 with a current in accordance with the load 13. In the case of a DC input, the power reception side power conversion circuit 12 may be only a rectifier circuit or may be a configuration further including a DC/DC converter. In the case of an AC input, the power reception side power conversion circuit 12 may be a configuration that has an AC/AC exchange function such as a configuration including the rectifier circuit, the DC/DC converter, a DC/AC converter, a matrix converter, or the like. The converters that are used include both non-insulated ones (such as choppers) and insulated ones (such as transformer-using ones).

The load 13 is a secondary battery that is capable of storing sufficient power as a driving power source of the vehicle 10. For example, the load 13 is a lithium-ion secondary battery, a nickel-hydrogen secondary battery, or the like. The load 13 may also be a power storage device (such as a battery and a large-capacity capacitor), a resistor-using load (such as a heating element and lighting equipment), an inductance-using load (such as a motor), or the like.

A heat transfer plate 14 is provided around the power reception side pad 11. The heat transfer plate 14 is arranged on a back face side of the power reception side pad 11 and supports the power reception side pad 11. In addition, the power reception side power conversion circuit 12 and the load 13 are provided on the heat transfer plate 14, and the heat transfer plate 14 is thermally connected to the power reception side pad 11, the power reception side power conversion circuit 12, and the load 13. This heat transfer plate 14 is formed from, for example, a metallic material such as aluminum that has a thermal conductivity.

The power transmission side pad 21 is provided on the road surface 2 to be capable of facing the power reception side pad 11. The park station 20 is provided with not only the power transmission side pad 21 but also a power transmission side DC-AC conversion circuit 22, a power transmission side power conversion circuit 23, and an external power source 24.

The power transmission side DC-AC conversion circuit 22 is a power transmission side inverter circuit including commonly used circuits such as half-bridge and full-bridge circuits. The power transmission side DC-AC conversion circuit 22 converts the power from the power transmission side power conversion circuit 23 to AC power in accordance with the resonant frequency of the wireless power supply using the magnetic field resonance method and supplies the AC power to the coil 21a.

The power transmission side power conversion circuit 23 is a power conversion circuit that converts the power which is supplied from the external power source 24 to DC power in accordance with the power transmission side DC-AC conversion circuit 22 and supplies the DC power to the power transmission side DC-AC conversion circuit 22. In the case of the AC input, the power transmission side power conversion circuit 23 may be a configuration that has an AC/DC conversion function. In the case of the AC input, in addition, the power transmission side power conversion circuit 23 may be a configuration that has a power factor correction (PFC) function. In the case of the DC input, the power transmission side power conversion circuit 23 may be a configuration that has a DC/DC function. The converters that are used include both non-insulated ones (such as choppers) and insulated ones (such as transformer-using ones).

The external power source 24 is, for example, a commercial power source, a solar battery, wind power generation, or the like. Power of the external power source 24 is supplied to the power transmission side power conversion circuit 23. In a case where the external power source 24 is a DC input, the DC input may be configured to be directly connected to the power transmission side DC-AC conversion circuit 22 with the power transmission side power conversion circuit 23 being absent.

This wireless power supply system 1 has a cooling device 30 that cools one or both (both in this embodiment) of the coils 11a and 21a provided on the vehicle 10 and the park station 20. The cooling device 30 according to this embodiment is attached to the park station 20.

Figure 2:
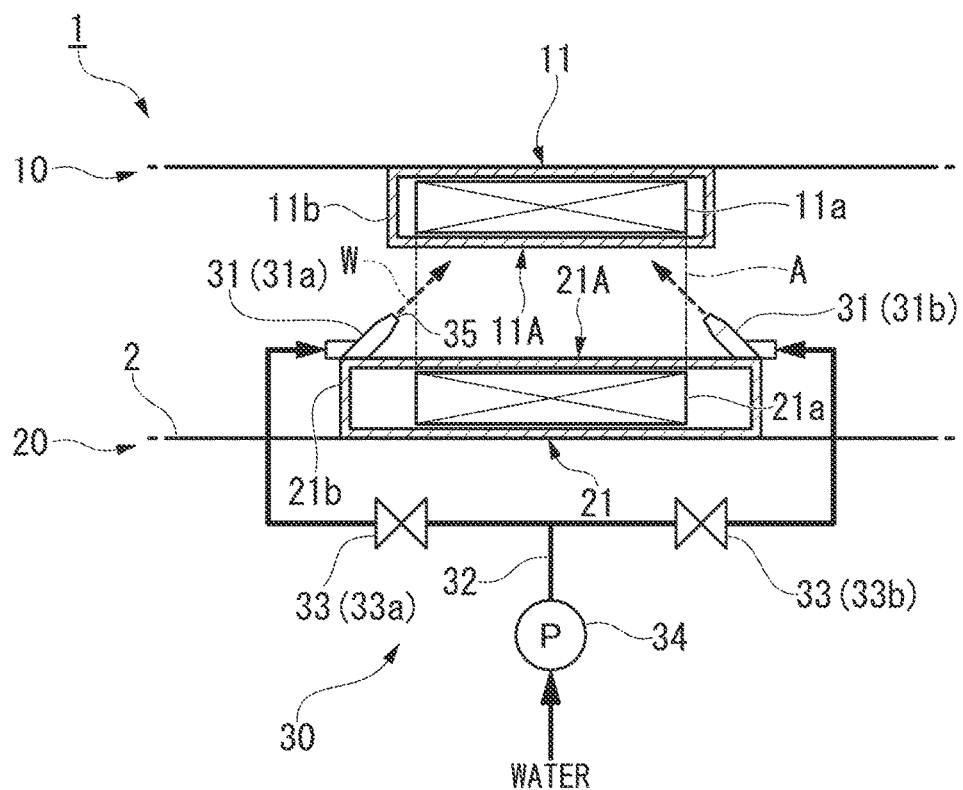
FIG. 2 is a configuration diagram showing a cooling device according to the first embodiment of the present disclosure.
Figure 3:
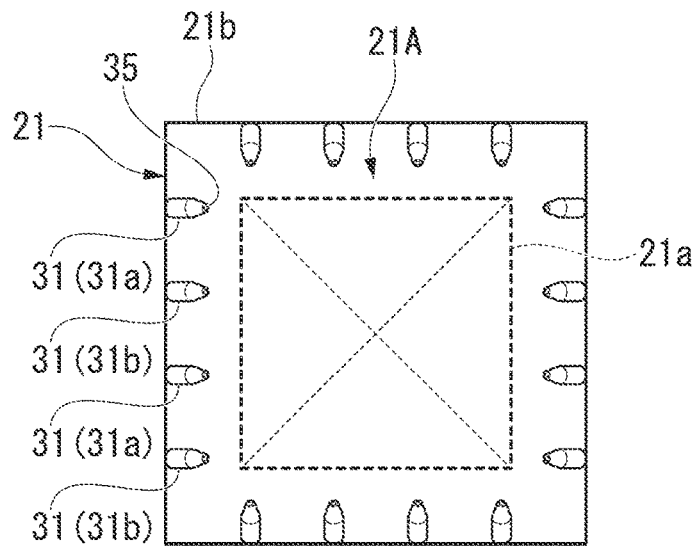
FIG. 3 is a plan view showing an arrangement of coolant jetting members according to the first embodiment of the present disclosure.

FIG. 2 is a configuration diagram showing the cooling device 30 according to the first embodiment of the present disclosure. FIG. 3 is a plan view showing an arrangement of coolant jetting members 31 according to the first embodiment of the present disclosure.

As shown in FIG. 2, the cooling device 30 is configured to cool the coils 11a and 21a by spraying a coolant W. The coolant W according to this embodiment is, for example, water from a water supply. The water from the water supply is non-magnetic and is low in conductivity, and thus a magnetic field between the coil 11a and the coil 21a is unlikely to be disturbed even if the water is present in an area where the magnetic field is generated by the wireless power supply. Accordingly, power efficiency of the wireless power supply is unlikely to be reduced even in the presence of the water. The type of the coolant W does not matter insofar as the coolant W is a liquid that is non-magnetic and is low in conductivity.

As shown in FIG. 2, the cooling device 30 has the coolant jetting members 31, a coolant flow line 32, electromagnetic valves 33, and a pump 34.

A coolant jet port 35 is formed in the coolant jetting member 31. The coolant jetting member 31 according to this embodiment is a nozzle that has a tip portion where the coolant jet port 35 is formed. This coolant jetting member 31 is a component, such as a resin molded component, formed of a non-magnetic and non-electroconductive material such that the electromagnetic field transferring the power during the wireless power supply is not interfered with.

Facing surfaces 11A and 21A of the power reception side pad 11 and the power transmission side pad 21 face each other at a time of the wireless power supply, and the coolant jetting members 31 are provided on the facing surface 21A. The coolant jet ports 35 are inclined at an angle to a facing direction (vertical direction on the paper surface in FIG. 2) in which the coils 11a and 21a face each other at the time of the wireless power supply. These coolant jetting members 31 are configured to jet the coolant W obliquely upwards from the outside of a facing region A where the electromagnetic field is generated by the wireless power supply between the coils 11a and 21a and perform the spraying of the coolant W toward the coil 11a.

As shown in FIG. 3, a plurality of the coolant jetting members 31 are provided on the facing surface 21A. The cooling device 30 according to this embodiment is configured to spray the coolant W in at least either one of a jet form and a mist form, and has coolant jetting members 31a that are provided with the coolant jet ports 35 which jet the coolant W in the jet form and coolant jetting members 31b that are provided with the coolant jet ports 35 which jet the coolant W in the mist form. As shown in FIG. 3, for example, the coolant jetting members 31a and the coolant jetting members 31b are alternately arranged along a peripheral edge portion of the cover member 21b.

As shown in FIG. 2, the coolant flow line 32 supplies the coolant W to the plurality of coolant jetting members 31. The coolant flow line 32 branches into each of the coolant jetting members 31 on a downstream side, and the electromagnetic valve 33 is provided for each of the branching lines. The electromagnetic valves 33 open and close flow paths of the coolant flow line 32. The electromagnetic valve 33a opens and closes the flow path of the coolant flow line 32 that is connected to the coolant jetting member 31a which jets the coolant W in the jet form. The electromagnetic valve 33b opens and closes the flow path of the coolant flow line 32 that is connected to the coolant jetting member 31b which jets the coolant W in the mist form.

The electromagnetic valves 33 include a metallic component, and thus are provided outside the area where the electromagnetic field is generated by the wireless power supply between the coils 11a and 21a (the power transmission side pad 21 or the vicinity thereof). In addition, it is preferable that parts of the coolant flow line 32 which intrude into the area where the electromagnetic field is generated is formed of a non-magnetic and non-electroconductive material, such as a resin hose, such that the electromagnetic field transferring the power during the wireless power supply is not interfered with. This coolant flow line 32 is connected to the pump 34 on an upstream side. The pump 34 raises a water pressure of the coolant W that is jetted from the coolant jetting member 31. This pump 34 is connected to, for example, the water supply.

The cooling device 30 that has the configuration described above is configured to switch between the jet form and the mist form of the sprayed coolant W by driving the electromagnetic valves 33a and 33b to be opened and closed. The cooling device 30 according to this embodiment is capable of switching to and from a first mode in which the coolant W is sprayed in the jet form by the electromagnetic valve 33a being opened and the electromagnetic valve 33b being closed, a second mode in which the coolant W is jetted in the mist form by the electromagnetic valve 33a being closed and the electromagnetic valve 33b being opened, and a third mode in which the coolant W is sprayed in both the jet form and the mist form by the electromagnetic valve 33a being opened and the electromagnetic valve 33b being opened. At a time of the third mode, the water pressure of the coolant W needs to be higher than in the other modes, and thus it is preferable that a control is performed such that a driving rotation speed of the pump 34 increases.

The cooling device 30 is configured to be operated based on the amounts of heat generation by the coils 11a and 21a. The amounts of the heat generation by the coils 11a and 21a can be obtained by, for example, measuring and comparing the power flowing through the power reception side power conversion circuit 12 and the power flowing through the power transmission side power conversion circuit 23 to each other. The power flowing through the power transmission side power conversion circuit 23 is not entirely sent to the power reception side power conversion circuit 12, and some of the power flowing through the power transmission side power conversion circuit 23 is lost as heat due to wiring resistances of the respective circuits 23 and 12 and coils 11a and 21a or the like. Accordingly, a power difference between the two can be determined to be a loss as heat, not as power supply. The cooling device 30 communicates with the vehicle 10 and the park station 20 via communication means (not shown), and the loss is large when the power difference between the two exceeds a certain value. In other words, it is determined that the amounts of the heat generation by the coils 11a and 21a are large, and the coolant W is sprayed. In addition, the cooling device 30 switches to and from the first to third modes based on the amounts of the heat generation by the coils 11a and 21a.

The amounts of the heat generation by the coils 11a and 21a can also be measured by a temperature sensor. For example, the cooling device 30 may be configured to determine that the amounts of the heat generation by the coils 11a and 21a are large and spray the coolant W, with the temperature sensor being installed on the cover member 21b, when a temperature of the dripping coolant W exceeds the certain value.

The coils 11a and 21a are covered by the cover members 11b and 21b and are waterproof. The cover members 11b and 21b accommodate the coils 11a and 21a in a liquid-tight manner and prevent a deterioration of coil winding insulation attributable to intrusion by the coolant W. The cover members 11b and 21b are water-resistant resin molded components and have non-magnetic and non-electroconductive properties. Thermal conductivity from the coils 11a and 21a to the cover members 11b and 21b may be enhanced by a material high in thermal conductivity (such as a non-magnetic and non-electroconductive heat transfer sheet) being physically buried between the coils 11a and 21a and the cover members 11b and 21b. In addition, the coils 11a and 21a may be made water-resistant by the coils 11a and 21a being sealed with a non-magnetic and non-electroconductive resin (such as epoxy resin) instead of the coils 11a and 21a being covered by the cover members 11b and 21b.

Hereinafter, a power supply operation of the wireless power supply system 1 that is configured as described above will be described.

As shown in FIG. 1, the wireless power supply system 1 performs the wireless power supply between the vehicle 10 and the park station 20. A park position of the vehicle 10 depends on a driver's driving operation, and thus has a variation to some extent. Regarding the power supply, the magnetic field resonance method is adopted for the power transmission between the coils 11a and 21a, and a high-efficiency and long-distance power transmission highly resistant to a positional deviation between the coils 11a and 21a provided on both the vehicle 10 and the park station 20 can be realized.

When the wireless power supply is performed, the coils 11a and 21a exchanging the high frequency power or the like generate heat. The park station 20, where the power transmission side pad 21 is provided, is provided on the ground side, and can increase the heat capacity or can increase a heat radiation capacity by a heat radiation fin or the like being provided. Accordingly, the temperature of the coil 21a rarely rises. The vehicle 10, where the power reception side pad 11 is provided, is smaller in heat capacity than the park station 20. The temperature of the coil 11a can be increased with relative ease.

As shown in FIG. 2, the wireless power supply system 1 has the cooling device 30 that sprays the coolant W. The cooling device 30 supplies the coolant W to the coolant jetting members 31 by opening the electromagnetic valves 33. The coolant jet ports 35 are provided in the coolant jetting members 31, and the coolant W is sprayed from the coolant jet ports 35 toward the coil 11a. The coolant W is extensively sprayed onto the facing surface 11A and removes the heat generated in the coil 11a via the cover member 11b. In addition, the coolant W sprayed onto the facing surface 11A drips onto the facing surface 21A and also removes the heat generated in the coil 21a via the cover member 21b.

Even in a case where the power reception side pad 11 is at a position substantially frontally facing the power transmission side pad 21 but assumed to entail a positional deviation, the coolant W diffuses in the air, over a certain range, as a result of the spraying from the coolant jetting members 31 and wet-spreads after the spraying. Accordingly, the power reception side pad 11 can be extensively cooled. Hence, the power reception side pad 11 can be cooled with a positional deviation being allowed between the vehicle 10 and the park station 20, and a high cooling capacity can be achieved. In this embodiment, the power reception side power conversion circuit 12 and the load 13 can also be cooled, via the heat transfer plate 14, by the power reception side pad 11 being cooled (refer to FIG. 1).

In addition, in this embodiment, the cooling device 30 sprays the coolant W at an angle to the facing direction in which the coils 11a and 21a face each other at the time of the wireless power supply. According to this configuration, the coolant W can be more extensively diffused and sprayed than in a case where the coolant W is vertically sprayed. Accordingly, the power reception side pad 11 can be cooled with a greater positional deviation being allowed between the vehicle 10 and the park station 20, and the high cooling capacity can be achieved.

Furthermore, the cooling device 30 sprays the coolant W in at least either one of the jet form and the mist form. The jet-form coolant W can cool an aimed place with a high level of directivity and has a high level of wet spreading property following the spraying. The spraying of this jet-form coolant W can be suitably used for cooling in, for example, a windy outdoor environment. The mist-form coolant W can cool a wide range with a high level of diffusivity, the tiny water droplets being likely to vaporize, and is likely to benefit from the heat of vaporization. The spraying of this mist-form coolant W can be suitably used for cooling in, for example, a garage where the wind rarely blows.

The cooling device 30 is capable of switching between the jet form and the mist form of the sprayed coolant W by driving the electromagnetic valves 33a and 33b to be opened and closed. The cooling device 30 according to this embodiment switches to and from the first to third modes based on the amounts of the heat generation by the coils 11a and 21a. During the wireless power supply in the garage, for example, the cooling device 30 switches to the first mode and performs the spraying of the coolant W in the jet form when, for example, the difference between the power flowing through the power reception side power conversion circuit 12 and the power flowing through the power transmission side power conversion circuit 23 exceeds a first threshold, switches to the second mode and performs the spraying of the coolant W in the mist form when, for example, the power difference exceeds a second threshold higher than the first threshold, and switches to the third mode and performs the spraying of the coolant W in both the jet form and the mist form when, for example, the power difference exceeds a third threshold higher than the second threshold. According to this configuration, the cooling can be performed in an efficient manner in accordance with the amounts of the heat generation by the coils 11a and 21a. In the case of the windy outdoor environment, the jet form has a higher level of cooling efficiency than the mist form, and thus the first mode and the second mode in the above-described control stage may be reversed.

In addition, in this embodiment, the coolant jetting members 31 have non-magnetic and non-electroconductive properties. According to this configuration, the coolant jetting members 31 neither interfere with the formation of the electromagnetic field of the wireless power supply nor generate heat due to an eddy current (or little if any). Accordingly, as shown in FIG. 2, the coolant jetting members 31 can be provided on the facing surface 21A, where the coils 11a and 21a face each other at the time of the wireless power supply, without the efficiency of the wireless power supply being reduced. By the coolant jetting members 31 being arranged in place on the facing surface 21A of the power transmission side pad 21 as described above, the cooling device 30 can save space.

Furthermore, in this embodiment, the coils 11a and 21a are covered by the non-magnetic and non-electroconductive cover members 11b and 21b. According to this configuration, the cover members 11b and 21b neither interfere with the formation of the electromagnetic field of the wireless power supply nor generate heat due to an eddy current (or little if any). The cover member 11b is waterproof so that the coolant W does not intrude into the coil 11a despite the spraying from below. In addition, the cover member 21b is waterproof so that the coolant W cooling the coil 11a does not intrude into the coil 21a despite falling from above.

As described above, the wireless power supply system 1 according to this embodiment that performs the wireless power supply between the vehicle 10 and the park station 20 by using the coils 11a and 21a adopts the configuration in which the cooling device 30 is provided to cool one or both of the coils 11a and 21a, which are provided on the vehicle 10 and the park station 20, by spraying of the coolant W. Hence, the coils 11a and 21a can be cooled with the positional deviation being allowed and with no cooling structure being provided for the vehicle 10, and the high cooling capacity can be achieved.

Accordingly, in this embodiment, the cooling device 30 and the wireless power supply system 1 are obtained with which the coils 11a and 21a, where heat is generated as a result of the wireless power supply, can be appropriately cooled with no time being required for positioning when the vehicle 10 and the park station 20 are in a relatively movable relationship.

Furthermore, the cooling device 30 according to this embodiment can appropriately cool the coils 11a and 21a since the coolant W still diffuses even in a case where the positional relationship between the vehicle 10 and the park station 20 changes during the cooling. The case where the positional relationship between the vehicle 10 and the park station 20 changes refers to a case where the vehicle 10 sways from side to side as the wind blows or the vehicle body is shaken vertically due to a change in the amount of the load that the vehicle 10 carries. This situation is particularly likely to arise in a case where the vehicle 10 has a suspension between a tire and the vehicle body as in the case of a passenger car.

Moreover, since the cooling device 30 according to this embodiment is attached to the park station 20, the coolant flow line 32 does not have to be extended to the vehicle side. In a case where the coolant flow line 32 is extended to the vehicle side, the coolant flow line 32 needs to be installed on the vehicle 10 or removed from the vehicle 10 depending on the movement of the vehicle 10 since the vehicle 10 moves. If the coolant flow line 32 is detachable, the coolant flow line 32 might wear each time the coolant flow line 32 is attached or detached. In this embodiment, however, the coolant flow line 32 (the cooling device 30) is fixed to the park station 20, and thus requires no detachable portion and is capable of ensuring durability.

(Second Embodiment)

Hereinafter, a second embodiment of the present disclosure will be described. In the following description, the same reference numerals will be used to refer to elements that are identical or equivalent to those of the above-described embodiment, and a description thereof will be simplified or omitted.

Figure 4:
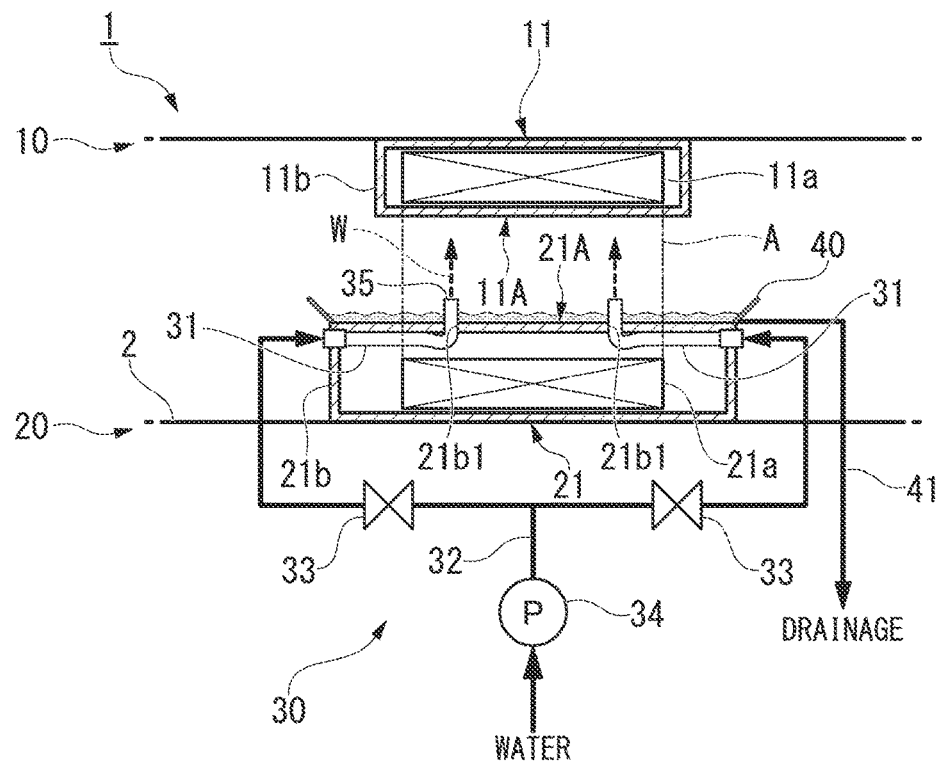
FIG. 4 is a configuration diagram of a cooling device according to a second embodiment of the present disclosure.

FIG. 4 is a configuration diagram of the cooling device 30 according to the second embodiment of the present disclosure.

As shown in FIG. 4, the second embodiment differs from the above-described embodiment in respect of the configuration of the coolant jetting members 31 and in that a receiving member 40 is provided.

The coolant jetting members 31 according to the second embodiment are hoses where the coolant jet ports 35 are provided. This coolant jetting member 31 is a resinous hose and has non-magnetic and non-electroconductive properties. The resinous hose is a pipe that is formed into the fixed shape which is shown in, for example, FIG. 4 or is a flexible pipe that is bent into the shape which is shown in FIG. 4. One end portion of the coolant jetting member 31 where the coolant jet port 35 is provided is provided in the facing region A where the coils 11a and 21a face each other at the time of the wireless power supply. The one end portion of the coolant jetting member 31 is exposed from a hole portion 21b1 of the cover member 11b open to the facing surface 21A. Space between the coolant jetting members 31 and the hole portions 21b1 are sealed in a liquid-tight manner by a sealing agent. In addition, the coolant jetting member 31 is connected to the coolant flow line 32 through an inner portion of the cover member 11b and via the other end portion exposed from a side portion of the cover member 11b.

The receiving member 40 recovers at least some of the sprayed coolant W. The receiving member 40 is provided integrally with the cover member 21b and has a flange shape, extending outwards from a peripheral edge portion of the cover member 11b. This receiving member 40 extends obliquely upwards with respect to the facing surface 21A. A drainage line 41 is connected to a side portion of the receiving member 40. The drainage line 41 drains the coolant W recovered by the receiving member 40 from the top of the facing surface 21A.

In addition, the cooling device 30 according to the second embodiment has the power reception side pad 11 positioned above the power transmission side pad 21 and sprays the coolant W while the wireless power supply is performed between the coils 11a and 21a (during the power transmission). Whether or not the power supply is in progress is determined based on, for example, whether or not a power command value toward the power transmission side power conversion circuit 23 exceeds a certain value or whether or not measured values of values of currents flowing through the power transmission side power conversion circuit 23 and the power reception side power conversion circuit 12 exceed a certain value. Furthermore, the cooling device 30 according to the second embodiment is set to perform the spraying of the coolant W for a certain predetermined period of time even after the power supply is stopped and is configured to reliably remove the heat that is generated as a result of the wireless power supply.

According to the second embodiment that has the above-described configuration, the cooling can be carried out by the coolant W being sprayed toward the coil 11a via the coolant jetting member 31. Even in the case where the power reception side pad 11 is at the position substantially frontally facing the power transmission side pad 21 but assumed to entail the positional deviation, the coolant W diffuses in the air, over a certain range, as a result of the spraying from the coolant jetting member 31 and wet-spreads after the spraying. Accordingly, the power reception side pad 11 can be extensively cooled. Hence, the power reception side pad 11 can be cooled with a positional deviation being allowed between the vehicle 10 and the park station 20, and a high cooling capacity can be achieved.

In addition, in the second embodiment, at least a part of the coolant jetting member 31 is provided in the facing region A where the coils 11a and 21a face each other at the time of the wireless power supply. According to this configuration, the coolant W can be sprayed from somewhere closer to the coil 11a than in a case where the coolant W is sprayed from the outside of the facing region A, and thus the spraying of the coolant W is likely to be concentrated on a place of the coil 11a that is more likely to generate heat. In addition, since the coolant jetting members 31 have the non-magnetic and non-electroconductive properties, the coolant jetting members 31 neither interfere with the formation of the electromagnetic field of the wireless power supply nor generate heat due to an eddy current (or little if any). Furthermore, the coolant jetting members 31 pass through the cover member 11b, and thus the coil 21a can be cooled from the inner portion of the cover member 11b.

The second embodiment has the receiving member 40 that recovers at least some of the sprayed coolant W. According to this configuration, an upper surface of the cover member 21b of the coil 21a can be given an enlarged saucer shape such that the dripping coolant W can be recovered and the recovered coolant W can be drained via the drainage line 41 from the top of the facing surface 21A. Then, the vicinity of the power transmission side pad 21 can be prevented from becoming wet with the coolant W, and thus an appropriate use becomes possible in a building such as a garage.

(Third Embodiment)

Hereinafter, a third embodiment of the present disclosure will be described. In the following description, the same reference numerals will be used to refer to elements that are identical or equivalent to those of the above-described embodiments, and a description thereof will be simplified or omitted.

Figure 5:
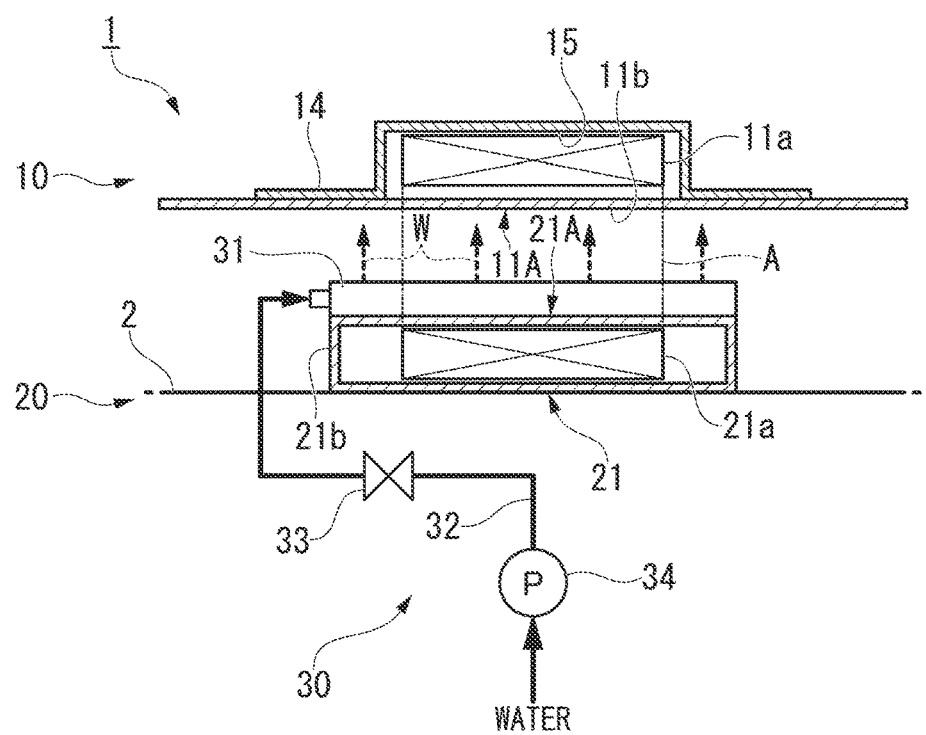
FIG. 5 is a configuration diagram of a cooling device according to a third embodiment of the present disclosure.
Figure 6:
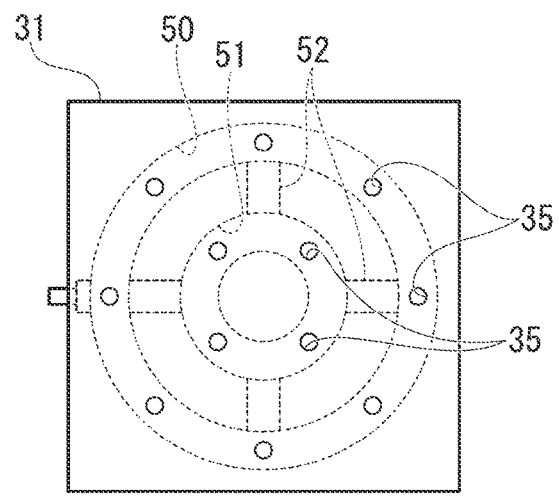
FIG. 6 is a plan view showing a coolant jetting member according to the third embodiment of the present disclosure.

FIG. 5 is a configuration diagram of the cooling device 30 according to the third embodiment of the present disclosure. FIG. 6 is a plan view showing the coolant jetting member 31 according to the third embodiment of the present disclosure.

As shown in FIG. 5, the third embodiment differs from the above-described embodiments in respect of the configuration of the heat transfer plate 14 and the cover member 11b and the configuration of the coolant jetting member 31.

The heat transfer plate 14 according to the third embodiment has a coil accommodating portion 15 that accommodates the coil 11a. The coil accommodating portion 15 surrounds a back face side and a side surface side of the coil 11a. Accordingly, the coil 11a does not protrude downwards from the vehicle 10. The heat transfer plate 14 is arranged such that the electromagnetic field which is formed between the coils 11a and 21a at the time of the wireless power supply is not blocked. In addition, the heat transfer plate 14 also serves as an electromagnetic shield. The cover member 11b according to the third embodiment is formed to have the shape of a plate and covers an opening of the coil accommodating portion 15 and the heat transfer plate 14 extending outwards.

The coolant jetting member 31 according to the third embodiment is configured to spray the coolant W toward the coil 11a and the heat transfer plate 14. As shown in FIG. 6, this coolant jetting member 31 is provided with the plurality of coolant jet ports 35. The coolant jetting member 31 is a resin molded manifold component formed to have the shape of a plate and a predetermined height, and a first annular flow path 50, a second annular flow path 51, and a plurality of connecting flow paths 52 are formed in the coolant jetting member 31. The first annular flow path 50 is connected to the coolant flow line 32 and communicates with the plurality of coolant jet ports 35 open to the facing surface 21A. The second annular flow path 51 is provided inside the first annular flow path 50, is connected to the first annular flow path 50 via the plurality of connecting flow paths 52, and communicates with the plurality of coolant jet ports 35 open to the facing surface 21A.

According to the third embodiment that has the configuration described above, the cooling can be carried out by the coolant W being sprayed toward the coil 11a via the coolant jetting member 31. Even in the case where the power reception side pad 11 is at the position substantially frontally facing the power transmission side pad 21 but assumed to entail the positional deviation, the coolant W diffuses in the air, over a certain range, as a result of the spraying from the coolant jetting member 31 and wet-spreads after the spraying. Accordingly, the power reception side pad 11 can be extensively cooled. Hence, the power reception side pad 11 can be cooled with a positional deviation being allowed between the vehicle 10 and the park station 20, and a high cooling capacity can be achieved.

In addition, in the third embodiment, the heat transfer plate 14 that is thermally connected to the coil 11a is provided, and the cooling device 30 sprays the coolant W toward both the coil 11a and the heat transfer plate 14. According to this configuration, the coil 11a can be cooled by the coolant W being sprayed toward the coil 11a and the coil 11a can be indirectly cooled by the coolant W being sprayed toward the heat transfer plate 14. Accordingly, the power reception side pad 11 can be cooled with a greater positional deviation being allowed between the vehicle 10 and the park station 20, and the high cooling capacity can be achieved. Furthermore, when the coolant jetting member 31 is formed as shown in FIG. 6, robustness can be enhanced because no projecting object is present on the power transmission side pad 21.

(Fourth Embodiment)

Hereinafter, a fourth embodiment of the present disclosure will be described. In the following description, the same reference numerals will be used to refer to elements that are identical or equivalent to those of the above-described embodiments, and a description thereof will be simplified or omitted.

Figure 7:
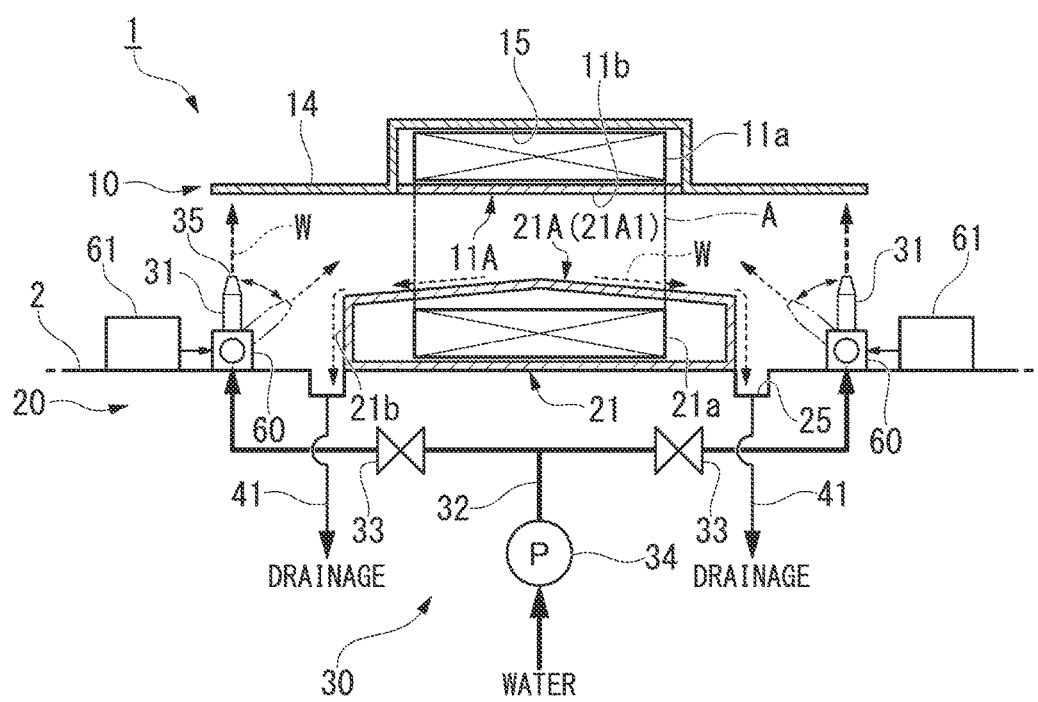
FIG. 7 is a configuration diagram of a cooling device according to a fourth embodiment of the present disclosure.

FIG. 7 is a configuration diagram of the cooling device 30 according to the fourth embodiment of the present disclosure.

As shown in FIG. 7, the fourth embodiment differs from the above-described embodiments in respect of the configuration of the cover members 11b and 21b and the configuration of the coolant jetting member 31.

The cover member 11b according to the fourth embodiment is provided to be fitted into the opening of the coil accommodating portion 15, and the heat transfer plate 14 is exposed to the bottom portion of the vehicle 10. A space between the cover member 11b and the coil accommodating portion 15 is sealed in a liquid-tight manner by a sealing agent. In addition, the cover member 21b according to the fourth embodiment covers the coil 21a, which is one of the coil 21a provided on the park station 20 and the coil 11a provided on the vehicle 10 that is on a lower side in a gravity direction. This cover member 21b has an inclined portion 21A1 that is inclined at an angle to the gravity direction. This inclined portion 21A1 forms the facing surface 21A, and is configured to be inclined downwards from a central portion toward the peripheral edge portion of the cover member 21b. Drainage grooves 25 are formed around the cover member 21b, and the drainage lines 41 are connected to bottom portions of the drainage grooves 25.

The coolant jetting members 31 according to the fourth embodiment have inclination adjusting devices 60. The coolant jetting member 31 is configured to be adjustable, by the inclination adjusting device 60, to at least an angle at which the coolant W can be sprayed toward the coil 11a (the cover member 11b) and an angle at which the coolant W can be sprayed toward the heat transfer plate 14. In addition, the cooling device 30 according to the fourth embodiment has control units 61 that drive the inclination adjusting devices 60. The control unit 61 controls the driving of the inclination adjusting device 60 in accordance with the size of the coil 11a. The control unit 61 is configured to enable wireless communication between the vehicle 10 and the park station 20 by, for example, diverting the coils 11a and 21a as antennae for signal transmission, transmit and receive information relating to the size of the coil 11a mounted on the vehicle 10 by this wireless communication, and control the driving of the inclination adjusting device 60 in accordance with the size of the coil 11a.

The coils 11a and 21a can have any size insofar as the wireless power supply is possible. The coil 11a and the coil 21a have the same size in some cases as shown in FIG. 7, but the coil 11a is smaller than the coil 21a in other cases. In a case where the coil 11a has the same size as the coil 21a or the coil 11a is smaller than the coil 21a, for example, the control unit 61 adjusts the inclination of the coolant jetting member 31 toward a heat-generating portion of the coil 11a (place in the cover member 11b where coil winding is arranged). In a case where the coil 11a is significantly smaller than the coil 21a, the control unit 61 adjusts the inclination of the coolant jetting member 31 toward the heat transfer plate 14 because the coolant W might not reach the coil 11a in this case.

According to the fourth embodiment that has the above-described configuration, the cooling can be carried out by the coolant W being sprayed toward the coil 11a via the coolant jetting member 31. Even in the case where the power reception side pad 11 is at the position substantially frontally facing the power transmission side pad 21 but assumed to entail the positional deviation, the coolant W diffuses in the air, over a certain range, as a result of the spraying from the coolant jetting member 31 and wet-spreads after the spraying. Accordingly, the power reception side pad 11 can be extensively cooled. Hence, the power reception side pad 11 can be cooled with a positional deviation being allowed between the vehicle 10 and the park station 20, and a high cooling capacity can be achieved.

In addition, in the fourth embodiment, the heat transfer plate 14 that is thermally connected to the coil 11a is provided, and the cooling device 30 sprays the coolant W toward the coil 11a or the heat transfer plate 14. When the coolant W is sprayed to the coil 11a, the heat-generating portion (the coil winding) can be directly cooled and the cooling efficiency is high. Furthermore, since the coolant W is unlikely to reach the coil 11a in some cases depending on the size of the coil 11a, the coil 11a can be cooled indirectly by the coolant W being sprayed to the heat transfer plate 14. As described above, according to this configuration, the cooling can be efficiently performed with the inclination of the coolant jetting member 31 adjusted in accordance with the size of the coil 11a.

Moreover, in the fourth embodiment, the cover member 21b is inclined at an angle to the gravity direction. According to this configuration, the coolant W dripping onto the upper surface of the cover member 21b of the coil 21a is allowed to fall from the facing surface 21A by the weight of the coolant W itself and accumulation of the coolant W can be prevented. The coolant W falling from the facing surface 21A is accumulated in the drainage grooves 25 and drained via the drainage lines 41. Then, the vicinity of the power transmission side pad 21 can be prevented from becoming wet with the coolant W, and thus an appropriate use becomes possible in a building such as a garage.

The preferred embodiments of the present disclosure have been described with reference to the accompanying drawings. However, the present disclosure is not limited to the above-described embodiments. The shapes, combinations, and the like of the respective constituting members that have been shown with regard to the embodiments described above are merely examples, and can be modified in various forms based on design requirements and the like without departing from the scope of the present disclosure.

For example, the water supplied from the water supply has been used as an example of the coolant W in the above-described embodiments. However, the type of the refrigerant does not matter insofar as it is non-magnetic and low in conductivity. In a case where this system is installed in a cold region, for example, those with a low freezing point may be used, examples of which include antifreeze such as ethylene glycol, a water-antifreeze mixture, and oil. In a case where the refrigerant other than water is used, the coolant can be effectively utilized by wastes or the like being removed through a filter and the refrigerant being re-used as the coolant instead of the recovered coolant being drained in the second embodiment or the fourth embodiment. In addition, the cooling device 30 may be configured to, for example, control the electromagnetic valve 33, with a temperature sensor measuring an outside air temperature being provided, such that the coolant W is not injected at a temperature at which the coolant W is expected to freeze.

According to the description of the above-described embodiments, the cooling device 30 is configured to cool both of the coils 11a and 21a. However, the cooling device 30 may also be configured to cool either the coil 11a or the coil 21a. For example, the cooling device 30 may be configured to cool only the coil 21a with the coolant jetting member 31 being provided toward the power transmission side pad 21.

According to the configuration of the embodiments described above, the power reception side power conversion circuit 12 and the load 13 are cooled via the heat transfer plate 14. In a case where the power reception side power conversion circuit 12 and the load 13 do not have to be cooled, however, the cooling device 30 may be configured to cool only the power reception side pad 11 with the heat transfer plate 14 omitted.

According to the fourth embodiment described above, the cover member 21b is shaped to be inclined outwards (has, for example, a cone shape and a pyramid shape) as the inclined portion 21A1 inclined at an angle to the gravity direction. However, the present disclosure is not limited to that shape. For example, the inclined portion 21A1 may be shaped to be inclined inward (may have, for example, an inverted cone shape). In this case, the coolant W is collected in the central portion of the cover member 21b, and thus the coolant W can be drained by the drainage line 41 being disposed in the central portion of the cover member 21b. In this case, the drainage grooves 25 may be omitted as well.

According to the description of the above-described embodiments, the power is supplied from the park station 20 on the ground side to the bottom portion of the vehicle 10. However, the power can be supplied in any direction. For example, the power may be configured to be supplied from a wall to a side portion, a front portion, or a rear portion of the vehicle 10 or the power may be configured to be supplied from a ceiling to a roof portion of the vehicle 10.

In the description of the above-described embodiments, a case where the power receiving device is the vehicle 10 and the power transmitting device is the park station 20 has been used as an example. However, the present disclosure is not limited to this configuration. For example, the power receiving device may be the park station 20 and the power transmitting device may be the vehicle 10. In addition, the present disclosure is also applicable even when at least either one of the power receiving device and the power transmitting device is a vehicle or a movable body such as a ship and aircraft.

The present disclosure is particularly effective when combined with the wireless power supply using the magnetic field resonance method by which a significant positional deviation can be allowed. However, even in the event of combination with wireless power supply based on another method, such as an electromagnetic induction method, the heat that is generated as a result of the wireless power supply can be removed.

In addition, the configurations of the respective embodiments described above can be replaced and combined in an appropriate manner.

INDUSTRIAL APPLICABILITY

According to the present disclosure, the cooling device and the wireless power supply system can be provided with which the coils, where the heat is generated as a result of the wireless power supply, can be appropriately cooled with no time being required for the positioning when the power receiving device and the power transmitting device are in the relatively movable relationship.

While preferred embodiments of the disclosure have been described and shown above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

What is claimed is:

1. A cooling device comprising:
   a coolant jetting member that is attached to a power transmitting device, wherein the power transmitting device performs wireless power supply to a movable power receiving device using a first coil; and
   a plurality of coolant jet ports formed in the coolant jetting member that spray a liquid coolant on a second coil provided on the power receiving device only when an amount of heat generated by the second coil exceeds a threshold;
   wherein at least a part of the coolant jetting member is provided in a facing region where the first coil and the second coil face each other during the wireless power supply.

2. The cooling device according to claim 1, comprising:
   a heat transfer plate thermally connected to the second coil provided on the power receiving device,
   wherein the plurality of coolant jet ports further spray the liquid coolant toward the heat transfer plate.

3. The cooling device according to claim 1,
   wherein the plurality of jet ports further spray the liquid coolant obliquely with respect to the facing region.

4. The cooling device according to claim 1,
   wherein the plurality of jet ports further spray the liquid coolant in at least either one of a jet form and a mist form.

5. The cooling device according to claim 1, wherein the coolant jetting member has non-magnetic and non-electroconductive properties.

6. The cooling device according to claim 1,
   wherein at least either one of the first coil and the second coil is covered by a non-magnetic and non-electroconductive cover member.

7. The cooling device according to claim 6, wherein the cover member covering covers a lower one in a gravity direction of either the first coil and the second coil.

8. The cooling device according to claim 1, further comprising:
a receiving member recovering at least a part of the liquid coolant that is sprayed.

9. A cooling device comprising:
a coolant jetting member that is attached to a power receiving device, wherein the power receiving device receives wireless power supply from a movable power transmitting device using a first coil; and
a plurality of coolant jet ports formed in the coolant jetting member that spray a liquid coolant on a second coil provided on the power transmitting device only when an amount of heat generated by the second coil exceeds a threshold;
wherein at least a part of the coolant jetting member is provided in a facing region where the first coil and the second coil face each other during the wireless power supply.

10. The cooling device according to claim 9, comprising:
a heat transfer plate thermally connected to the second coil provided on the power transmitting device, wherein the plurality of jet ports further spray the liquid coolant toward the heat transfer plate.

11. The cooling device according to claim 9, wherein the plurality of jet ports further spray the liquid coolant obliquely with respect to the facing region.

12. The cooling device according to claim 9, wherein the plurality of jet ports further spray the liquid coolant in at least either one of a jet form and a mist form.

13. The cooling device according to claim 9, wherein the coolant jetting member has non-magnetic and non-electroconductive properties.

14. The cooling device according to claim 9, wherein at least either one of the first coil and the second coil is covered by a non-magnetic and non-electroconductive cover member.

15. The cooling device according to claim 14, wherein the cover member covering covers a lower one in a gravity direction of either the first coil and the second coil.

16. The cooling device according to claim 9, further comprising:
a receiving member recovering at least a part of the liquid coolant that is sprayed.

17. A wireless power supply system comprising:
a first coil formed in a first power transfer device that wirelessly transfers power supply with a movable second power transfer device;
a second coil formed in the movable second power transfer device that transfers the power supply with the first coil; and
a coolant jetting member that is attached to the first power transfer device and includes a plurality of coolant jet ports that spray a liquid coolant on the second coil only when an amount of heat generated by the second coil exceeds a threshold;
wherein at least a part of the coolant jetting member is provided in a facing region where the first coil and the second coil face each other during the power supply.

18. The wireless power supply system according to claim 17, wherein the first power transfer device transmits the power supply to the movable second power transfer device.

19. The wireless power supply system according to claim 17, wherein the first power transfer device receives the power supply from the movable second power transfer device.

* * * * *